United States Patent
Miller et al.

(10) Patent No.: US 12,130,312 B2
(45) Date of Patent: Oct. 29, 2024

(54) METHOD TO DETECT SIGNAL CORRUPTION FROM CONDUCTIVE DUST IN A CIRCUIT BREAKER

(71) Applicant: EATON INTELLIGENT POWER LIMITED, Dublin (IE)

(72) Inventors: Theodore J. Miller, McDonald, PA (US); James I. Wise, Cranberry Township, PA (US); David Rohn, Venetia, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 212 days.

(21) Appl. No.: 17/965,558

(22) Filed: Oct. 13, 2022

(65) Prior Publication Data
US 2024/0125824 A1  Apr. 18, 2024

(51) Int. Cl.
*G01R 19/165* (2006.01)
*G01R 15/18* (2006.01)
*G08B 21/18* (2006.01)

(52) U.S. Cl.
CPC ..... *G01R 19/16571* (2013.01); *G01R 15/181* (2013.01); *G08B 21/185* (2013.01)

(58) Field of Classification Search
CPC ............ G01R 15/181; G01R 19/16571; G08B 21/185
See application file for complete search history.

(56) References Cited

U.S. PATENT DOCUMENTS 8,950,239 B2  2/2015  Kuczynski et al.
10,416,062 B2  9/2019  Hedayat et al.
(Continued)

FOREIGN PATENT DOCUMENTS

GB  2 259 150 A  3/1993

OTHER PUBLICATIONS

D.A. Ward et al: "Using Rogowski coils 1-15 for transient current measurements", Engineering Science and Education Journal, vol. 2, No. 3, Jan. 1, 1993 (Jan. 1, 1993), p. 105, XP055228714, GB ISSN: 0963-7346, DOI: 10.1049/esej:19930034 figures 2, 3.
(Continued)

*Primary Examiner* — Alesa Allgood
(74) *Attorney, Agent, or Firm* — Eckert Seamans Cherin & Mellott, LLC

(57) ABSTRACT

Systems and methods are provided for monitoring the effects of conductive dust deposits that compromise the ability of a trip unit to accurately detect AC current in a circuit interrupter. When a Rogowski coil is used as a current sensor in the circuit interrupter and the trip unit processes the output of the Rogowski coil using a printed circuit board assembly (PCBA) processing circuit, the DC component of the processing circuit output signal can be analyzed to determine whether any conductive dust has formed unintended electrical pathways on the PCBA and compromised the ability of the PCBA to accurately measure AC current in the circuit interrupter. It can be determined that such unintended electrical pathways have formed when the DC component of the processing circuit output either exceeds a predetermined threshold or has increased by a significant amount after opening of the separable contacts.

17 Claims, 4 Drawing Sheets

(56) References Cited

U.S. PATENT DOCUMENTS

| | | | |
|---|---|---|---|
| 2007/0007969 A1* | 1/2007 | Dai | H02M 7/48 |
| | | | 324/601 |
| 2013/0057307 A1 | 3/2013 | Fischer | |
| 2017/0063070 A1 | 3/2017 | Miller et al. | |
| 2019/0265015 A1 | 8/2019 | Michiwaki | |
| 2022/0179011 A1 | 6/2022 | Matsubara et al. | |

OTHER PUBLICATIONS

Yu-Jun Xia et al: "A precision analogue integrator system for heavy current measurement in MFDC resistance spot welding", Measurement Science and Technology, IOP, Bristol, GB, vol. 27, No. 2, Dec. 29, 2015 (Dec. 29, 2015), p. 25104, XP020297308, ISSN: 0957-0233, DOI: 10.1088/0957-0233/27/2/025104 [retrieved on Dec. 29, 2015] figures 1, 2.

European Patent Office "International Search Report and Written Opinion", for corresponding International (PCT) Patent Application No. PCT/EP2023/025434, date of actual completion of the international search: Jan. 23, 2024, 13 pp.

* cited by examiner

METHOD TO DETECT SIGNAL CORRUPTION FROM CONDUCTIVE DUST IN A CIRCUIT BREAKER

FIELD OF THE INVENTION

The disclosed concept relates generally to circuit interrupters, and in particular, to systems and methods for monitoring the effect of dust on the performance of printed circuit board assemblies used to measure current in circuit interrupters.

BACKGROUND OF THE INVENTION

Circuit interrupters, such as for example and without limitation, circuit breakers, are typically used to protect electrical circuitry from damage due to various trip conditions, including an overcurrent condition, such as an overload condition, a short circuit, or another fault condition, such as an arc fault or a ground fault. Referring to FIG. 1, circuit interrupters such as the schematically depicted circuit interrupter 1 are generally structured to be electrically connected between a power source 2 and a load 3 via line and neutral conductors 4, 6. Circuit interrupters typically include separable electrical contacts 8, which operate as a switch. When the separable contacts 8 are in contact with one another in a closed state, current can flow through any circuits connected to the circuit interrupter 1. When the separable contacts 8 are isolated from one another in an open state, current is prevented from flowing through any circuits connected to the circuit interrupter 1. Typically, circuit interrupters include an operating mechanism 10 designed to rapidly open or close the separable contacts 8, and a trip monitoring mechanism, such as an electronic trip unit 12, which uses a current sensor 14 or other type of sensor to detect a number of fault conditions. Upon sensing a fault condition, the trip unit 12 is configured to instruct the operating mechanism 10 to trip open the separable contacts 8.

Rogowski coils are one type of current sensor 14 often used to monitor the AC current flowing through a circuit interrupter 1. While modern Rogowski coils are often implemented as printed circuit board (PCB) circuits and the exact geometry of a Rogowski coil can vary between specific implementations, the general principles of Rogowski coils are discussed herein in conjunction with the traditional Rogowski coil 14 schematically depicted in FIG. 2. The traditional Rogowski coil 14 is structured as a non-ferromagnetic core 15 formed generally as a loop, with a conductive wire 16 wound around the core 15. A first portion 17 of the wire 16 forms a number of turns and is wound around the core 15, and a second portion 18 of the wire is a return portion fed through the interior of the core 15. The return portion 18 of the wire 16 generally lies in a plane.

To measure the current flowing through the circuit interrupter 1, the Rogowski coil 14 is positioned to detect the current flowing through one of the conductors carrying current through the circuit interrupter 1, such as, for example and without limitation, the line conductor 4. In order to detect the current flowing through the line conductor 4, the Rogowski coil 14 is positioned so that the line conductor 4 and the current flow i(t) pass through the center of the Rogowski coil 14. The end of the first wire portion 17 and the end of the second wire portion 18 are positioned at approximately the same location of the core 15, and form output terminals of the Rogowski coil. The AC current i(t) through the line conductor 4 produces a first voltage signal v(t) across the output terminals. This output voltage v(t) is proportional to the rate of change, di/dt, of the current through the line conductor 4, i(t). The output terminals of the Rogowski coil are connected to an integrator 20 that produces a second voltage signal V(t), with the second voltage signal V(t) being proportional to the current i(t) through the line conductor 4. Thus, the current through the line conductor 4 can be determined based on the V(t) signal. It will be appreciated that the integrator 20 can comprise a microcontroller that performs the integration digitally.

Rogowski coils, their associated integrators, and other circuitry used to monitor current through the circuit interrupter 1 are often implemented as circuits on printed circuit board assemblies (PCBAs). While PCBAs are advantageous in several respects, the performance of PCBAs in a circuit interrupter can be noticeably compromised by dust produced during circuit interrupter operations and present due to environmental conditions. For example and without limitation, arcing during opening operations of the separable contacts 8 can cause the conductive surfaces of the separable contacts 8 to wear down with each opening operation and deposit conductive dust on the PCBA of the trip unit 12, and can also cause various plastic components within the circuit interrupter 1 to deteriorate and produce plastic dust that also gets deposited on the PCBA of the trip unit 12. Dust from the ambient environment can get deposited on the trip unit 12 PCBA as well. As expected, when too much dust accumulates on the PCBA, the functionality of the PCBA can be comprised and interfere with the proper operation of the circuit interrupter 1.

Traditional approaches to solving the problems posed by dust deposits on PCBAs have focused on preventing dust from being deposited on the PCBA. Such approaches have included using silicone shields, Kapton tape, or conformal coatings as a physical barrier to prevent dust from being deposited on the PCBA, as well as enclosing current sensing electronics in a housing that prevents dust from current interruption operations (i.e. opening of the separable contacts 8) from being deposited on PCBAs. However, there are several downsides to such approaches. First, the placement of such barriers can be variable when performed automatically and often require human intervention for precise placement, thus significantly slowing manufacturing processes. Second, it is usually the case that multiple PCBAs are connected to one another using connectors, and using dust-prevention barriers can prevent PCBAs from fully seating/mating all the way, resulting in malfunctioning of the PCBA circuits. Third, the aforementioned barriers such as silicone shields, Kapton tape, and conformal coatings can become compromised over time as conductive dust gets deposited on these barriers, such that unintentional electrical pathways can still form and phantom currents can flow (phantom currents being those currents flowing through the unintended electrical pathways). In laboratory tests with compromised barriers, phantom currents have been measured on PCBAs even when the separable contacts 8 of the circuit interrupter 1 have been open. The presence of these phantom currents indicates that the electronic trip unit 12 would prematurely trip open the circuit interrupter 1 if the circuit interrupter 1 were placed into service, and also leads to inaccurate pass/fail ratings of the trip unit PCBA during testing.

There is thus room for improvement in mitigating the effect of dust on the performance of electronic trip units of circuit interrupters.

SUMMARY OF THE INVENTION

These needs, and others, are met by systems and methods disclosed herein that overcome the shortcomings of traditional dust deposit-prevention approaches implemented for PCBAs of electronic trip units. Rather than focusing solely on preventing dust from being deposited on PCBAs, the disclosed systems and methods focus on accurately detecting and monitoring dust deposits so that PCBAs and other circuitry can be replaced once there is indication that dust deposits have compromised the performance of the PCBAs past a predetermined acceptable threshold.

In accordance with one aspect of the disclosed concept, a detection system for determining whether the AC current sensing ability of a trip unit has been compromised comprises a sensor output processing circuit and a controller. The sensor output processing circuit is configured to receive and process sensed output from a current sensor of the circuit interrupter, and to output a processed output signal representative of the current flowing through the circuit interrupter. The controller is configured to receive the processed output signal and to analyze the processed output signal. The controller is also configured to isolate a DC component of the processed output signal from an AC component of the processed output signal, to compare the DC component of the processed output signal to a predetermined acceptable DC component threshold, and to determine whether the DC component of the processed output signal reflects an unacceptable increase from a previously detected DC component of a next-most recently previously analyzed processed output signal. The controller is further configured to issue an alarm if the controller determines that the DC component of the processed output signal either: exceeds the predetermined acceptable DC component threshold or reflects the unacceptable increase.

In accordance with another aspect of the disclosed concept, a method of determining whether the AC current sensing ability of a circuit interrupter has been compromised comprises: receiving an output of a current sensor as an input to a sensor output processing circuit, the current sensor being configured to sense AC current through the circuit interrupter; processing the current sensor output with the sensor output processing circuit to produce a processed output signal representative of current flowing through the circuit interrupter; isolating, with a controller configured to receive the processed output signal, a DC component of the processed output signal; comparing, with the controller, the DC component of the processed output signal to a predetermined acceptable DC component threshold and to previously detected DC component levels with the controller; and issuing an alarm with the controller if the controller determines that the DC component of the processed output signal either exceeds the predetermined acceptable DC component threshold or reflects an unacceptable increase from the previously detected DC component levels.

In accordance with a further aspect of the disclosed concept, a circuit interrupter structured to be electrically connected between a power source and a load comprises: a pair of separable contacts comprising a stationary contact and a movable contact disposed between the power source and the load; a Rogowski coil configured to sense current flowing between the power source and the load, the Rogowski coil comprising output terminals; and an electronic trip unit. The electronic trip unit comprises a controller and a printed circuit board assembly (PCBA) comprising a sensor output processing circuit. The sensor output processing circuit is configured to receive and process a signal output by the Rogowski coil output terminals, and to output a processed output signal representative of the current flowing through the circuit interrupter. The controller is configured to receive and analyze the processed output signal, to isolate a DC component of the processed output signal from an AC component of the processed output signal, to compare the DC component of the processed output signal to a predetermined acceptable DC component threshold, and to determine whether the DC component of the processed output signal reflects an unacceptable increase from a previously detected DC component of a next-most recently previously analyzed processed output signal. The controller is configured to issue an alarm if the controller determines that the DC component of the processed output signal either: exceeds the predetermined acceptable DC component threshold or reflects the unacceptable increase.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Figure 1:
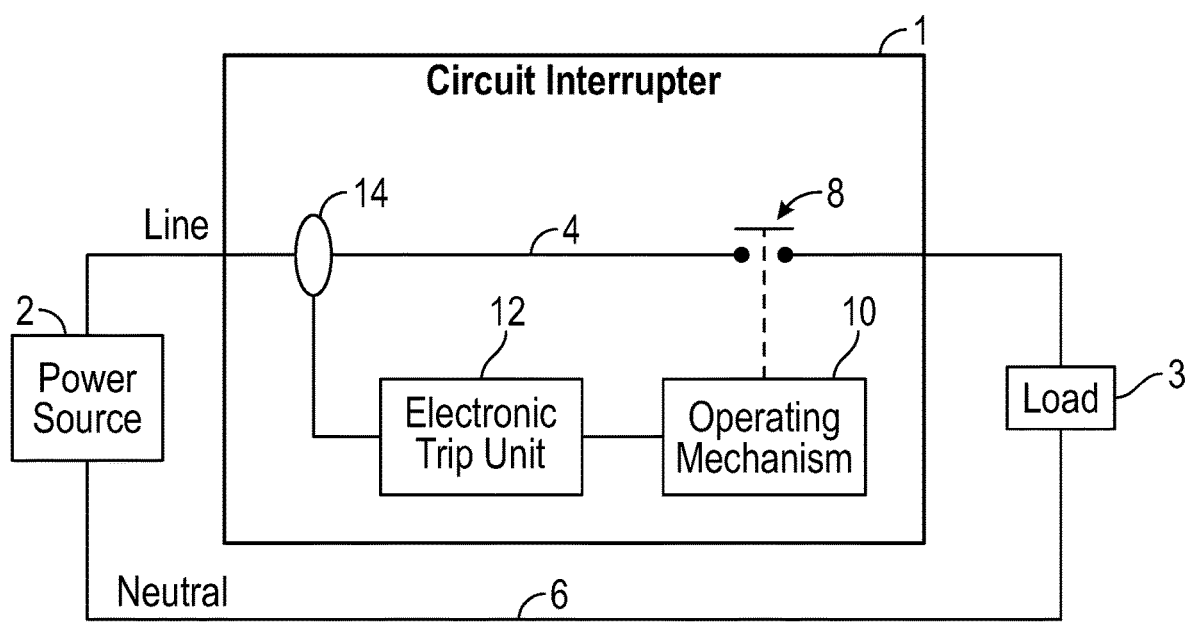
FIG. 1 is a schematic diagram of a circuit interrupter including a current sensor and an electronic trip unit.

Directional phrases used herein, such as, for example, left, right, front, back, top, bottom and derivatives thereof, relate to the orientation of the elements shown in the drawings and are not limiting upon the claims unless expressly recited therein.

As employed herein, the term "controller" shall mean a programmable analog and/or digital device that can store, retrieve and process data; a control circuit; a computer; a workstation; a personal computer; a microprocessor; a microcontroller; a microcomputer; a processor; a central processing unit; a mainframe computer; a mini-computer; a server; a networked processor; or any suitable processing device or apparatus.

As employed herein, the statement that two or more parts are "coupled" together shall mean that the parts are joined together either directly or joined through one or more intermediate parts.

As employed herein, when ordinal terms such as "first" and "second" are used to modify a noun, such use is simply intended to distinguish one item from another, and is not intended to require a sequential order unless specifically stated.

As employed herein, the term "number" shall mean one or an integer greater than one (i.e., a plurality).

Systems and methods are disclosed herein to address the shortcomings of traditional dust deposit-prevention approaches discussed above. Rather than focusing on preventing dust from being deposited on PCBAs, the disclosed systems and methods focus on accurate detection and monitoring of dust deposits so that PCBAs and other circuitry can be replaced once there is indication that dust deposits have compromised the performance of the PCBAs past a predetermined acceptable threshold.

Figure 3:
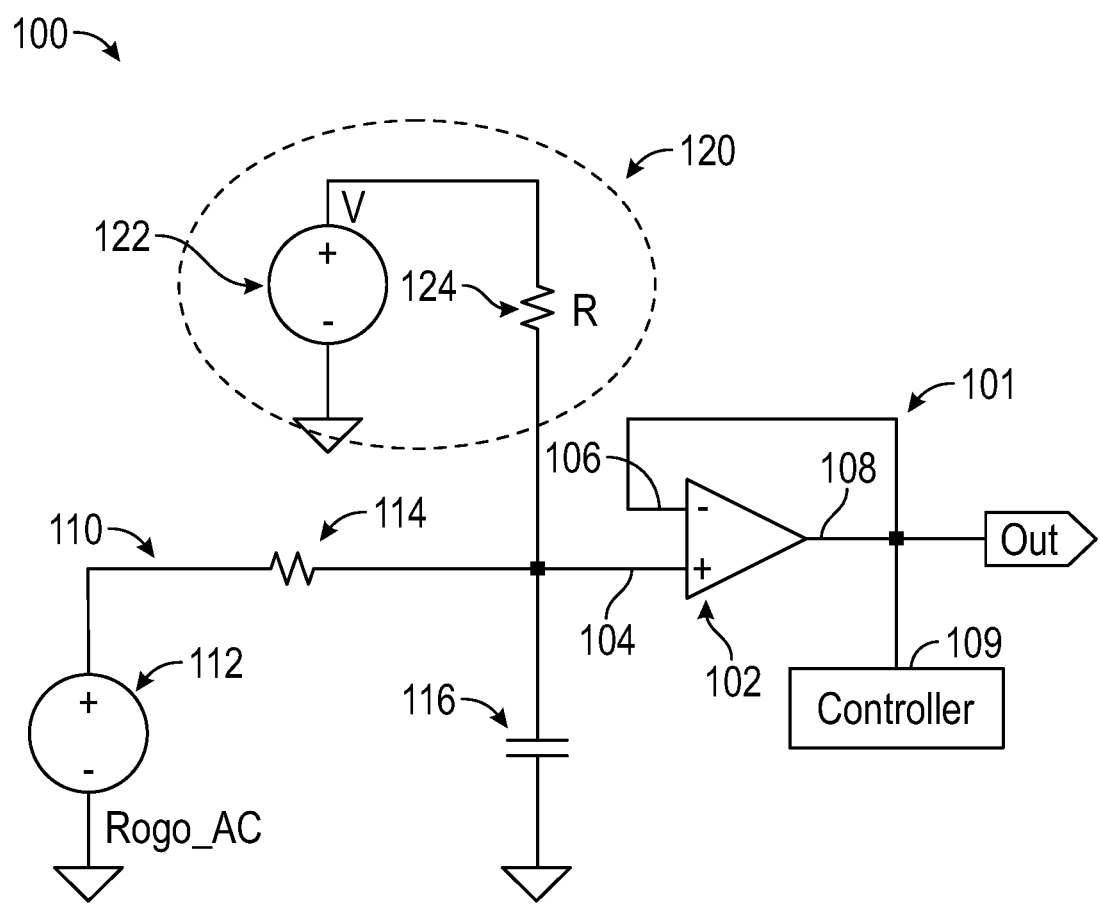
FIG. 3 is a schematic circuit diagram of circuitry used to identify foreign matter interfering with proper operation of a printed circuit board assembly of an electronic trip unit, such as the electronic trip unit schematically depicted in FIG. 1, in accordance with an example embodiment of the disclosed concept.

Referring first to FIG. 3, a schematic diagram for a detection system 100 used to identify dust on a PCBA of the electronic trip unit 12 is shown, in accordance with exemplary embodiments of the disclosed concept. In exemplary embodiments, the circuitry of detection system 100 is formed on the trip unit 12 PCBA itself. As shown in FIG. 3, the detection system 100 includes a sensor output processing circuit 101 comprising an operational amplifier ("op amp") 102 whose non-inverting terminal 104 receives input from two voltage branches (a sensor output branch 110 and nuisance branch 120), while the inverting terminal 106 is connected to the op amp output 108. The non-inverting terminal 104 is sometimes alternatively referred to herein as the "sensor output processing circuit input" 104, and the op amp output 108 is sometimes alternatively referred to herein as the "sensor output processing circuit output" 108. The detection system 100 further includes a controller 109 that is connected to the op amp output 108 in order to process the op amp output signal 108, for example and without limitation, by passing the output signal 108 to an analog-to-digital ("A/D") converter.

The sensor output branch 110 includes the ground referenced voltage signal 112 (also labeled "Rogo_AC" in the figure) output by the Rogowski coil 14. The resistor 114 and capacitor 116 are connected in series across the Rogowski coil output 112, with the voltage across the capacitor 116 being input to the op amp non-inverting terminal 104. The configuration of the resistor 114 and capacitor 116 shown in FIG. 3 is sometimes referred to herein as RC configuration 114, 116. It will be appreciated that the voltage signal 112 corresponds to the signal v(t) shown in FIG. 2, and that the RC configuration 114, 116 can function as an integrator corresponding to the integrator 20 shown in FIG. 2. The op amp 102 serves as a buffer between the integrator and the controller 109.

Depending on the relative values of the resistor 114 and capacitor 116, the RC configuration 114, 116 can alternatively function as a filter instead of an integrator. In addition, integration can alternatively be performed digitally by the controller 109 on the op amp output signal 108 (instead of being performed by the RC configuration 114, 116 on the voltage signal 112). Regardless of whether the RC configuration 114, 116 functions as an integrator or a filter, the processing circuit output signal 108 is representative of the current flow i(t) through the circuit interrupter 1, as the output signal 108 is either a voltage signal that is proportional to the current i(t) (in the case of the RC configuration 114, 116 functioning as an integrator) or a filtered voltage signal that can be related to the current i(t) by an integration equation (in the case of the RC configuration 114, 116 functioning as a filter). It is noted that integration of the Rogowski coil output 112 can also be performed by circuit configurations other than the one shown in FIG. 3, and it will be appreciated that such other circuit configurations can be implemented in the sensor output processing circuit 101 to perform integration without departing from the scope of the disclosed concept.

For the voltage signal that is input to the input terminal 104 by the sensor output branch 110, the relevant time constant t is determined by the resistance R of the resistor 114 and the capacitance C of the capacitor 116: $\tau$=RC. Whether the RC configuration 114, 116 performs as an integrator or a filter is a function of the relative values of the time constant t and the period T of the Rogowski coil output signal 112. For example, when the power source 2 supplying power to the circuit interrupter 1 is the utility grid, the Rogowski coil output signal 112 will have the same frequency as utility power. For a 60 Hz sine wave, the period T is 16.7 ms. For a 50 Hz sine wave, the period T is 20 ms. If the time constant t is relatively large relative to the period T of the Rogowski coil output 112, then the RC configuration 114, 116 functions as an integrator, and if the time constant $\tau$ is relatively small relative to the period T of the Rogowski coil output 112, then the RC configuration 114, 116 functions as a filter.

Figure 2:
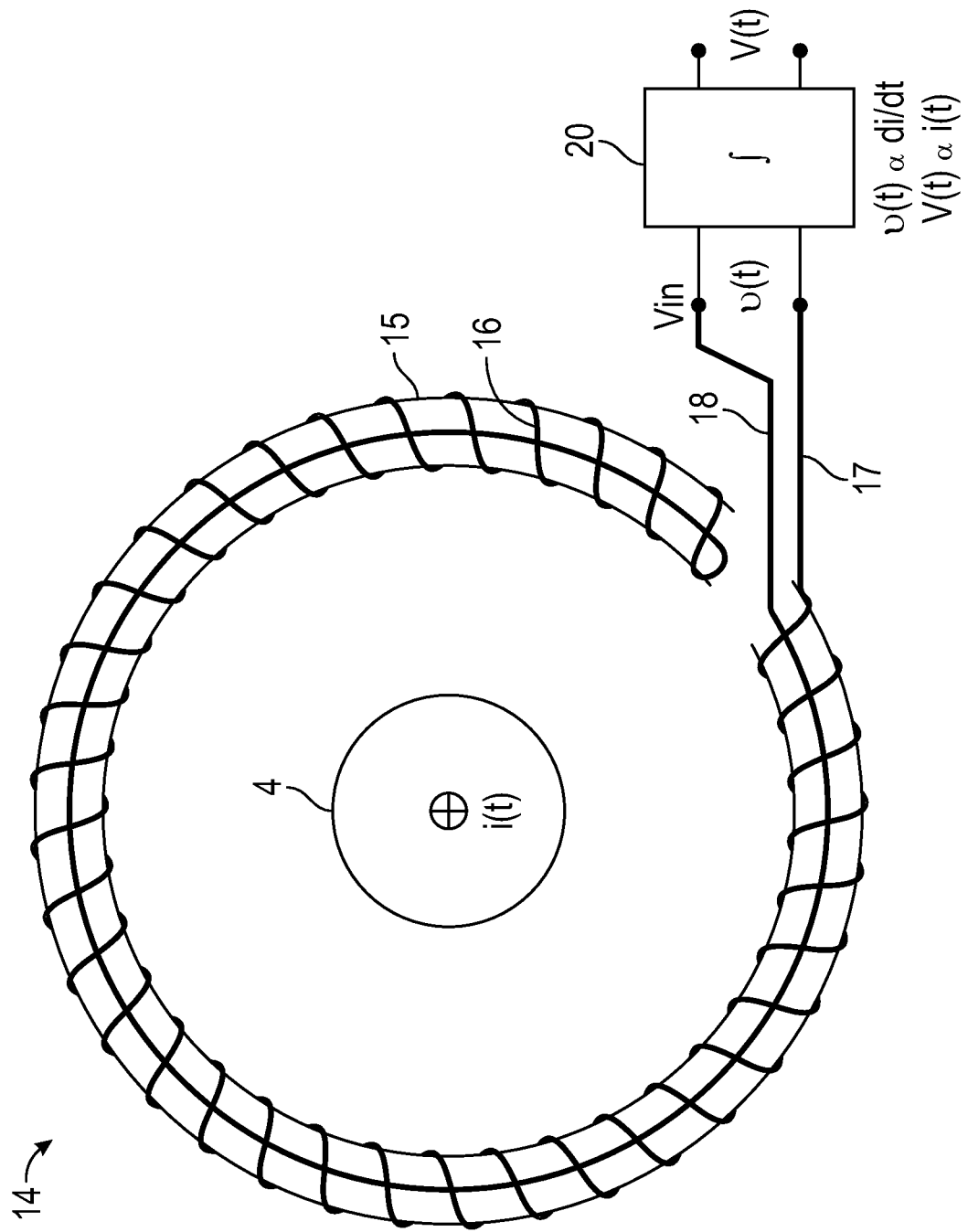
FIG. 2 is a schematic diagram of a Rogowski coil that can be used as a current sensor in a circuit interrupter such as the circuit interrupter schematically depicted in FIG. 1.

Assuming momentarily that the nuisance branch 120 is not providing input to the op amp terminal 104, if the resistor 114 and capacitor 116 are utilized as an integrator, then the output 108 of the op amp 102 is a voltage signal V(t) proportional to the current i(t) flowing through the line conductor 4 of the circuit interrupter 1 (or whichever conductor of the circuit interrupter is being monitored), this voltage signal V(t) corresponding to the voltage signal V(t) that is the output by the integrator 20 shown in FIG. 2. However, if the resistor 114 and capacitor 116 are instead used as a filter and integration is performed digitally by the controller 109, then the output 108 of the op amp 102 is a filtered voltage signal $v_f(t)$ proportional to the rate of change di/dt of the current, and the controller 109 will output a voltage signal V(t) proportional to the current i(t) flowing through the circuit interrupter 1 (and corresponding to the output of the integrator 20 shown in FIG. 2).

The nuisance branch 120 in FIG. 3 depicts how an unintended nuisance connection can form between an electrical component on the PCBA (a low-voltage DC power supply 122) and the input 104 of the sensor output processing circuit 101. When a non-nominal amount of conductive dust or other particles (referred to hereinafter as "foreign matter") is deposited on the PCBA, the foreign matter can form unintended electrical connections (referred to hereinafter as "nuisance connections") between the non-inverting input 104 of the op amp 102 and other electrical components of the PCBA, such as traces, part-leads, connectors, and low-voltage DC power supplies. While the op amp 102 or controller 109 would otherwise only output a voltage signal V(t) proportional to the current i(t) through the circuit interrupter 1 if the nuisance branch were not present, the unintended deposit of conductive foreign matter on the PCBA leads to the formation of the nuisance branch 120 and to the V(t) signal comprising a non-nominal DC component that is not attributable to the output signal 112 of the Rogowski coil 14.

Power supply 122 is used as a non-limiting representative example of an electrical component that is typically included on a trip unit 12 PCBA and is not intended to be connected as an input 104 to the sensor output processing circuit 101. Assuming that the power supply 122 is a 3.3V DC supply, under ideal conditions when there is no ascertainable nuisance connection from the power supply 122 to the non-inverting input 104, and the resistance value 124 is functionally infinite. The resistance value 124 under such ideal conditions is a leakage resistance and may be on the scale of >100 GΩ, for example and without limitation. Resistor 114 typically has a resistance value on the scale of 100 kΩ. Under ideal conditions, capacitor 116 is an open circuit (due to power supply 122 being DC), the op amp input 104 draws no current, and the Rogowski coil output 112 is treated as a zero impedance voltage source, thus, a voltage divider is formed by the leakage resistance 124 and resistor 114 being connected between the 3.3 V power supply 122 and ground. As a result, the voltage that is input by the power supply 122 to the op amp input terminal 104 is the voltage $V_{114,Psupply}$ that appears across resistor 114, which is calculated as follows: $V_{114,Psupply}=(R_{114}/R_{124})*3.3V=(100 \text{ k}\Omega/100 \text{ G}\Omega)*3.3V=3.3 \text{ μV}$. This means that power supply 122 only supplies ~3.3 μV to the op amp input 104 under ideal conditions, due to the ratio of the resistance $R_{124}$ to $R_{114}$ being 1,000,000 to 1.

In contrast, when a non-nominal amount of conductive foreign matter forms a nuisance connection 120 from the power supply 122 to the non-inverting input 104, the resistance value 124 decreases noticeably to a functionally finite value, and the ratio of resistance 124 to resistance 114 decreases noticeably from the 1,000,000 to 1 ratio as well, resulting in a noticeable increase to the voltage that power supply 122 provides to the non-inverting input 104. Because the voltage provided by the power supply 122 to the non-inverting input 104 is a DC voltage, the DC component of the output signal 108 noticeably increases when there is a nuisance connection 120. Under ideal conditions when there is no ascertainable nuisance connection from the power supply 122 to the non-inverting input 104, only a nominal DC component is expected to be present at non-inverting input 104, with the nominal DC component being attributable to op amp 102 error, so an increase in the DC component of the output signal 108 due to a nuisance connection 120 will be apparent.

Thus, when there is no nuisance connection 120 to the non-inverting input 104, the sensor output processing circuit output 108 comprises only the voltage signal V(t) that is attributable to the Rogowski coil output 112 and is proportional to the line conductor 4 current i(t). Conversely, when there is a detectable nuisance connection 120, the circuit output 108 comprises both the voltage signal V(t) and a significant DC component attributable to the nuisance connection 120. The controller 109 is configured to continuously monitor the output signal 108, and to determine whether: (1) the DC component of the output signal 108 exceeds a predetermined DC component threshold, or (2) if there is an significant change in the DC component of the output signal 108. The predetermined DC component threshold is chosen to represent a maximum DC component expected to be present in the output signal 108 and attributable solely to op amp 102 error. It is noted that integration of the Rogowski coil output signal 112 (whether by the resistor 114 and capacitor 116 or by the controller 109) is not actually necessary for the purpose of determining whether there is a nuisance connection 120, as the presence of the nuisance connection 120 only requires determining what the DC component of the output signal 108 is.

A significant change in the DC component of the output signal 108 is indicative of arcing occurring during an opening operation of the separable contacts 8 and causing particles from the surfaces of the separable contacts 8 to be deposited onto the trip unit 12 PCBA (said significant change being a comparison of the DC component of the output signal 108 prior to the opening operation and after the opening operation). Detection of a DC component in the output signal 108 that exceeds the predetermined DC component threshold or detection of a significant change in the DC component of the output signal 108 causes the controller 109 to generate an alert or alarm for the user. The alarm indicates to the user that the circuit interrupter 1 should be taken out of service in order to determine what components of the circuit interrupter 1 should be refurbished, replaced, etc. It is expected, for example and without limitation, that either or both of the separable contacts 8, and/or the trip unit 12 PCBA would need to be replaced.

The output 108 of the sensor output processing circuit 101 is an exemplary location for detecting the presence of a nuisance connection 120 due to the input 104 being high impedance, thus making the input 104 sensitive to changes in the nuisance branch resistance 124. It should be noted that the output 108 of a sensor output processing circuit 101 used to process a Rogowski coil voltage signal 112 is simply one example of a location in a circuit interrupter 1 to which the principles described herein can be applied, that a Rogowski coil is only one of the several types of current sensors 14 that can be used, and that the principles described herein can be extrapolated to other locations within a circuit interrupter 1 and to other types of current sensors 14 without departing from the scope of the disclosed concept. For example, if a type of current sensor 14 other than a Rogowski coil were used, it would still be possible to detect evidence of nuisance connections based on there being a higher than expected DC component to the signal used by the trip unit 12 to measure current. In the context of using a Rogowski coil as the current sensor 14, the sensor output processing circuit 101 is described herein as performing integration and/or filtering, since the output signal of a Rogowski coil needs to be integrated in order to determine the current i(t) through the circuit interrupter, but it will be appreciated that other types of sensor output processing circuits that perform other mathematical operations and/or other signal processing functions suitable for current sensors 14 other than Rogowski coils can and should be used as appropriate.

Figure 4:
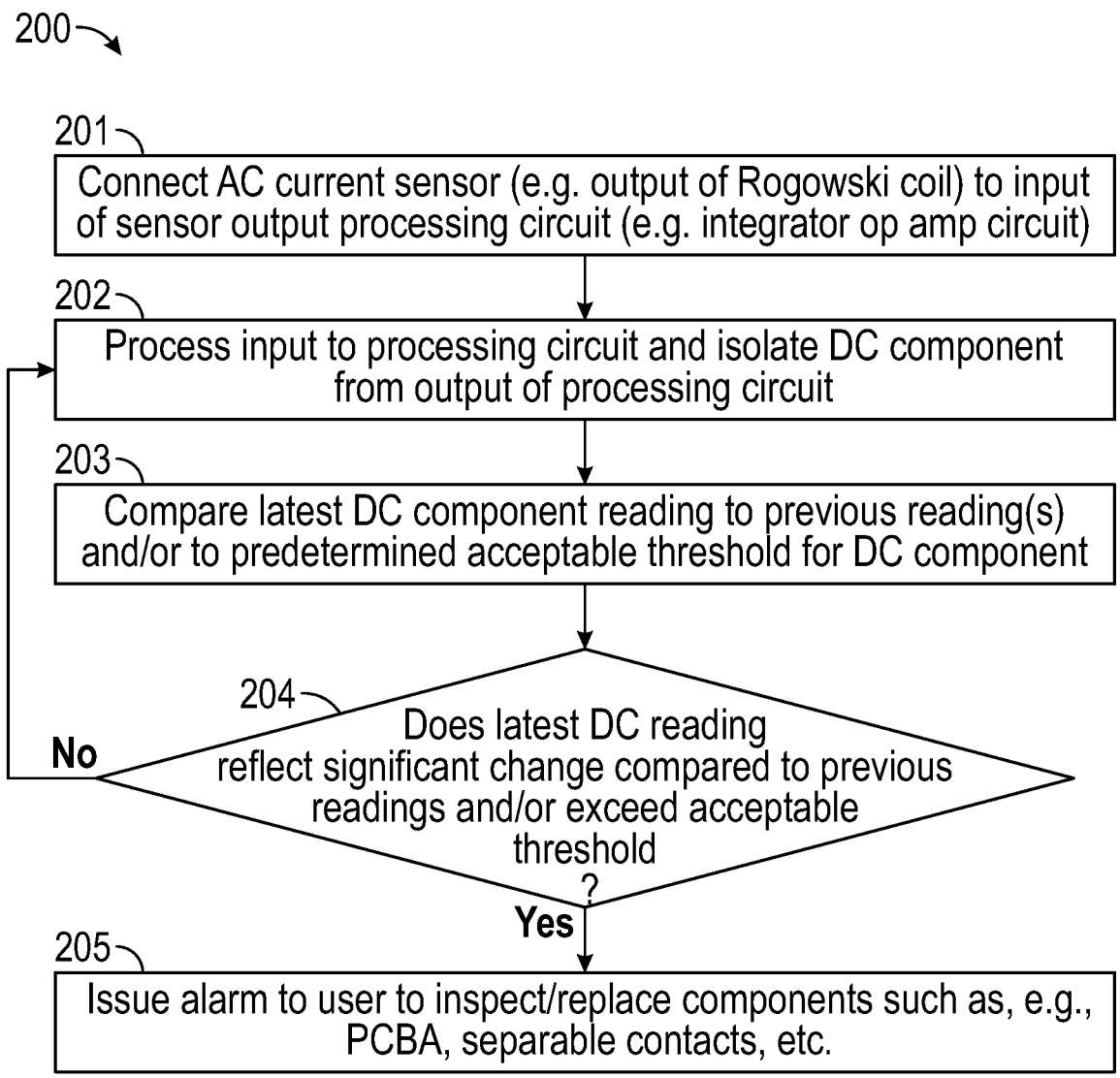
FIG. 4 is a flow chart of a method for determining whether foreign matter is interfering with proper operation of a printed circuit board assembly of an electronic trip unit of a circuit interrupter, in accordance with an example embodiment of the disclosed concept.

FIG. 4 is a flowchart of a method 200 for detecting a nuisance connection in a PCBA of a circuit interrupter in accordance with an example embodiment of the disclosed concept. The method of FIG. 4 may be employed, for example, with a circuit interrupter 1, a Rogowski coil current sensor 14, and a sensor output processing circuit 101 as shown in FIGS. 1, 2, and 3, and is described herein in conjunction with the circuit interrupter 1, Rogowski coil current sensor 14, and sensor output processing circuit 101 as shown in FIGS. 1, 2, and 3. However, it will be appreciated that the method 200 may be employed in other devices as well without departing from the scope of the disclosed concept.

The method begins at 201, where an AC current sensor 14 (e.g. the output terminals of the Rogowski coil 14) is connected to the input of a sensor output processing circuit 101 (e.g. the non-inverting terminal 104 of the op amp 102). At 202, the sensor output processing circuit 101 processes the output from the current sensor 14 and the controller 109 isolates the DC component from the output signal 108 of the sensor output processing circuit 101. At 203, the controller 109 compares the DC component of the output signal 108 either to a predetermined acceptable threshold DC component level, to the next-most recent previously detected DC component level, or to both. At 204, if the controller 109 determines that the latest detected DC component of the output signal 108 exceeds the predetermined acceptable DC threshold and/or indicates that there is an unacceptable increase in the magnitude of the DC component as compared to the most recently detected DC component level, then the method proceeds to step 205. At 205, an alarm is issued to the user to inspect/refurbish/replace any compromised components of the circuit interrupter 1, such as for example and without limitation, the trip unit 12 PCBA, either or both of the separable contacts 8, etc. If instead at 204, the latest detected DC component of the output signal 108 does not exceed the predetermined threshold and/or does not indicate that there is an unacceptable increase in the magnitude of the DC component, then the method returns to 202 to continue monitoring the DC component of the output signal 108. It will be appreciated that steps 202-204 are intended to be performed continuously as long as the circuit interrupter 1 is in operation.

While specific embodiments of the invention have been described in detail, it will be appreciated by those skilled in the art that various modifications and alternates to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A detection system for determining whether the AC current sensing ability of a trip unit has been compromised, the detection system comprising:
    a sensor output processing circuit configured to receive and process sensed output from a current sensor of the circuit interrupter, and to output a processed output signal representative of the current flowing through the circuit interrupter; and
    a controller configured to receive the processed output signal and to analyze the processed output signal,
    wherein the controller is configured to isolate a DC component of the processed output signal from an AC component of the processed output signal,
    wherein the controller is configured to compare the DC component of the processed output signal to a predetermined acceptable DC component threshold, and to determine whether the DC component of the processed output signal reflects an unacceptable increase from a previously detected DC component of a next-most recently previously analyzed processed output signal, and
    wherein the controller is configured to issue an alarm if the controller determines that the DC component of the processed output signal either: exceeds the predetermined acceptable DC component threshold or reflects the unacceptable increase.

2. The detection system of claim 1,
    wherein the current sensor is a Rogowski coil with output terminals, and the sensed output from the current sensor is a non-integrated voltage signal across the output terminals of the Rogowski coil that is proportional to a rate of change of the current flowing through the circuit interrupter.

3. The detection system of claim 2,
    wherein either the sensor processing circuit comprises circuitry configured to integrate the non-integrated voltage signal, or the controller is configured to digitally integrate the processed output signal.

4. The detection system of claim 2,
    wherein the sensor output processing circuit comprises a resistor, a capacitor, and an operational amplifier, the operational amplifier comprising a non-inverting input terminal and an inverting input terminal,
    wherein the Rogowski coil output terminals are connected in series between the operational amplifier non-inverting input terminal and ground reference voltage, and
    wherein the resistor and the capacitor are connected in series across the Rogowski coil output terminals, such that voltage across the capacitor is input to the operational amplifier non-inverting input terminal.

5. The detection system of claim 4,
    wherein the resistor and the capacitor form an AC integrator.

6. The detection system of claim 4,
    wherein the resistor and the capacitor form a filter, and wherein the controller is configured to digitally integrate an output signal of the operational amplifier.

7. A method of determining whether the AC current sensing ability of a circuit interrupter has been compromised, the method comprising:
    receiving an output of a current sensor as an input to a sensor output processing circuit, the current sensor being configured to sense AC current through the circuit interrupter;
    processing the current sensor output with the sensor output processing circuit to produce a processed output signal representative of current flowing through the circuit interrupter;
    isolating, with a controller configured to receive the processed output signal, a DC component of the processed output signal;
    comparing, with the controller, the DC component of the processed output signal to a predetermined acceptable DC component threshold and to previously detected DC component levels with the controller; and
    issuing an alarm with the controller if the controller determines that the DC component of the processed output signal either exceeds the predetermined acceptable DC component threshold or reflects an unacceptable increase from the previously detected DC component levels.

8. The method of claim 7,
    wherein the current sensor is a Rogowski coil with output terminals, and the current sensor output is a non-integrated voltage signal across the output terminals of the Rogowski coil that is proportional to a rate of change of the current flowing through the circuit interrupter.

9. The method of claim 8, further comprising:
    integrating the non-integrated voltage signal either with the sensor output processing circuit or with the controller.

10. The method of claim 8,
    wherein the sensor output processing circuit comprises a resistor, a capacitor, and an operational amplifier, the operational amplifier comprising a non-inverting input terminal and an inverting input terminal,
    wherein the Rogowski coil output terminals are connected in series between the operational amplifier non-inverting input terminal and ground reference voltage, and
    wherein the resistor and the capacitor are connected in series across the Rogowski coil output terminals, such that voltage across the capacitor is input to the operational amplifier non-inverting input terminal.

11. The method of claim 10, further comprising:
    integrating the non-integrated voltage signal with the resistor and the capacitor.

12. The method of claim 10, further comprising:
    filtering the non-integrated voltage signal with a filter comprising the resistor and the capacitor, and
    digitally integrating an output signal of the operational amplifier with the controller.

13. A circuit interrupter structured to be electrically connected between a power source and a load, the circuit interrupter comprising:
    a pair of separable contacts comprising a stationary contact and a movable contact disposed between the power source and the load;

a Rogowski coil configured to sense current flowing between the power source and the load, the Rogowski coil comprising output terminals; and an electronic trip unit, the electronic trip unit comprising:
- a printed circuit board assembly, PCBA, comprising a sensor output processing circuit; and
- a controller, wherein the sensor output processing circuit is configured to receive and process a signal output by the Rogowski coil output terminals, and to output a processed output signal representative of the current flowing through the circuit interrupter, wherein the controller is configured to receive and analyze the processed output signal, wherein the controller is configured to isolate a DC component of the processed output signal from an AC component of the processed output signal, wherein the controller is configured to compare the DC component of the processed output signal to a predetermined acceptable DC component threshold, and to determine whether the DC component of the processed output signal reflects an unacceptable increase from a previously detected DC component of a next-most recently previously analyzed processed output signal, and wherein the controller is configured to issue an alarm if the controller determines that the DC component of the processed output signal either: exceeds the predetermined acceptable DC component threshold or reflects the unacceptable increase.

14. The circuit interrupter of claim 13,
wherein the signal output by the Rogowski coil output terminals is a non-integrated voltage signal that is proportional to a rate of change of the current flowing through the circuit interrupter,
wherein either the sensor output processing circuit comprises circuitry configured to integrate the non-integrated voltage signal, or the controller is configured to digitally integrate the processed output signal.

15. The circuit interrupter of claim 13,
wherein the sensor output processing circuit comprises a resistor, a capacitor, and an operational amplifier, the operational amplifier comprising a non-inverting input terminal and an inverting input terminal,
wherein the Rogowski coil output terminals are connected in series between the operational amplifier non-inverting input terminal and ground reference voltage, and
wherein the resistor and the capacitor are connected in series across the Rogowski coil output terminals, such that voltage across the capacitor is input to the operational amplifier non-inverting input terminal.

16. The circuit interrupter of claim 15,
wherein the resistor and the capacitor form an AC integrator.

17. The circuit interrupter of claim 15,
wherein the signal output by the Rogowski coil output terminals is a non-integrated voltage signal that is proportional to a rate of change of the current flowing through the circuit interrupter,
wherein the resistor and the capacitor form a filter, and
wherein the controller is configured to digitally integrate an output signal of the operational amplifier.

* * * * *